(12) United States Patent
Joshi et al.

(10) Patent No.: US 7,973,549 B2
(45) Date of Patent: Jul. 5, 2011

(54) METHOD AND APPARATUS FOR CALIBRATING INTERNAL PULSES IN AN INTEGRATED CIRCUIT

(75) Inventors: Rajiv V. Joshi, Yorktown Heights, NY (US); Robert L. Franch, Wappingers Falls, NY (US); Robert Maurice Houle, Williston, VT (US); Kevin A. Batson, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 11/761,610

(22) Filed: Jun. 12, 2007

(65) Prior Publication Data

US 2008/0309364 A1    Dec. 18, 2008

(51) Int. Cl.
*G01R 31/02* (2006.01)
(52) U.S. Cl. .................. 324/762.01; 324/750.3
(58) Field of Classification Search .......... 324/73.1, 324/765, 158.1, 76.52; 714/700, 733–734; 368/107–121; 438/14–18
See application file for complete search history.

(56) References Cited

U.S. PATENT DOCUMENTS

| | | | |
|---|---|---|---|
| 4,595,992 A * | 6/1986 | Drogin | 702/79 |
| 5,708,382 A * | 1/1998 | Park | 327/277 |
| 5,956,290 A | 9/1999 | Matsuzaki | |
| 6,166,992 A | 12/2000 | Takemae et al. | |
| 6,288,587 B1 | 9/2001 | Chen et al. | |
| 6,462,996 B2 | 10/2002 | Ooishi | |
| 6,583,642 B2 * | 6/2003 | Huang et al. | 324/765 |
| 6,885,228 B2 * | 4/2005 | McWilliams | 327/158 |
| 6,933,754 B2 | 8/2005 | Restle | |
| 7,057,182 B2 | 6/2006 | Kitchin | |
| 7,378,833 B2 * | 5/2008 | Wagner | 324/76.54 |
| 2003/0179027 A1 * | 9/2003 | Kizer et al. | 327/158 |
| 2003/0193843 A1 * | 10/2003 | Krahe et al. | 368/113 |
| 2005/0094448 A1 * | 5/2005 | Lee et al. | 365/200 |
| 2005/0107970 A1 | 5/2005 | Franch et al. | |
| 2005/0204211 A1 * | 9/2005 | Gouin et al. | 714/702 |
| 2005/0257109 A1 * | 11/2005 | Averbuj et al. | 714/733 |
| 2005/0278595 A1 * | 12/2005 | Anzou | 714/733 |
| 2006/0245519 A1 | 11/2006 | Cheng et al. | |
| 2007/0080701 A1 * | 4/2007 | Kim et al. | 324/765 |
| 2007/0086250 A1 | 4/2007 | Zimlich | |
| 2007/0103141 A1 | 5/2007 | Dixon et al. | |

OTHER PUBLICATIONS

Zheng et al., "On-chip Oscilloscopes for Noninvasive time-domain measurement of waveforms in digital integrated circuits", IEEE Transactions; Jun. 2003; pp. 1-9.

* cited by examiner

*Primary Examiner* — Ha Tran T Nguyen
*Assistant Examiner* — Arleen M Vazquez
(74) *Attorney, Agent, or Firm* — Tutunjian & Bitetto, PC; Brian P. Verminski, Esq.

(57) ABSTRACT

A method and circuit for measuring internal pulses includes an enable circuit configured to receive a control signal from an on-chip built-in tester to enable measurement of internal circuits. A delay chain is configured to receive a pulse signal from an on-chip circuit component. Sampling latches each include a data input coupled between adjacent delay elements of the delay chain and synchronized with the clock signal such that a transition in the pulse signal is indicated by comparing adjacent digital values in an output sequence.

9 Claims, 9 Drawing Sheets

METHOD AND APPARATUS FOR CALIBRATING INTERNAL PULSES IN AN INTEGRATED CIRCUIT

BACKGROUND

1. Technical Field

The present invention relates to circuit testing and more particularly to a system, apparatus and method for calibrating internal pulses in an array or integrated circuit to determine component function.

2. Description of the Related Art

Measurement of internal signals in memory devices, logic circuits or other integrated circuits is useful is determining circuit functionality, stability and reliability. Internal signals include any signal not normally output from a circuit but may be employed in the development of an output or simply employed during operations of the circuit. Since these signals are not directly output, they are difficult to measure.

Measurement of internal signals provides information about the operation and function of integrated circuits, which could be used to diagnose problems with the operation or design of a given chip or circuit. Conventional, techniques for the measurement of internal signals for e.g., SRAMs, are available through a PICA tool. The PICA tool uses a microscope to monitor emissions of a circuit to determine circuit activity during operation. The PICA tool is expensive and can be complicated and time consuming to employ. The lead time and measurement complications and set-ups can be enormous with the PICA tool, and in-line measurements (i.e., direct testing) are not available.

SUMMARY

A method and circuit for measuring internal pulses includes an inverter chain configured to receive a pulse signal from an on-chip circuit component. Sampling latches each have a data input coupled between adjacent inverters in the inverter chain and are synchronized with the clock signal such that a transition in the pulse signal is indicated by comparing adjacent digital values in an output sequence.

A method and circuit for measuring internal pulses includes an enable circuit configured to receive a control signal from an on-chip built-in tester to enable measurement of internal circuits. A delay chain is configured to receive a pulse signal from an on-chip circuit component. Sampling latches each include a data input coupled between adjacent delay elements of the delay chain and synchronized with the clock signal such that a transition in the pulse signal is indicated by comparing adjacent digital values in an output sequence.

Another circuit includes a multiplexer configured to switch an output between a clock signal and a signal pulse for internal signals of an integrated circuit. An inverter chain is configured to receive the output of the multiplexer. Sampling latches, each having a data input, are coupled between adjacent inverters in the inverter chain and synchronized with the clock signal. A logic gate is configured to logically combine sampling latch outputs for two adjacent sampling latches such that transitions in the clock signal and the pulse signal are indicated by comparing the sampling latch outputs. Accumulating latches are coupled to the sampling latches, the accumulating latches outputting a bit in a bit sequence to indicate the transition.

A method for measuring internal pulses in an integrated circuit includes enabling operation of an on-chip pulse measuring circuit in accordance with a built-in self test engine, receiving a pulse signal from an on-chip circuit component, applying the pulse signal to an inverter chain, tapping the inverter chain between adjacent inverters with sampling latches, where each sampling latch has a data input coupled to the inverter chain, and comparing adjacent outputs of the sampling latches in an output sequence to indicate a transition in the signal pulse.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles include circuits and methods for measuring features of internal circuits. In particularly useful embodiments, a skitter circuit is provided and is employed to detect edges or transitions in internal signals for on-chip applications. Using the transition information output from the skitter circuit, pulse widths, access times and other relevant information can be obtained for internal pulses in a circuit.

In one embodiment, the circuit may be incorporated into a circuit library and may be incorporated into a chip design. In this way, internal pulses for circuits and components may be monitored and measured to provide information on operational functions and output directly from the chip being tested or measured.

Embodiments of the present invention can take the form of an entirely hardware embodiment, an entirely software embodiment or an embodiment including both hardware and software elements. In a preferred embodiment, the present invention is implemented in hardware; however, software elements and software embodiments may be employed. The software may include but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Circuits as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present embodiments may be employed for a plurality of different measurements on a plurality of different devices or circuits, the present principles will illustratively be described for a static random access memory (SRAM) and the measurement will be for pulsewidth and/or access time for SRAM components. It should be understood that other internal signals may be measured on other digital circuits in accordance with the present principles. It should also be understood that the skitter circuit described herein may be modified or reconfigured using different components having a same or similar functionality as described herein in accordance with the present principles.

Figure 1:
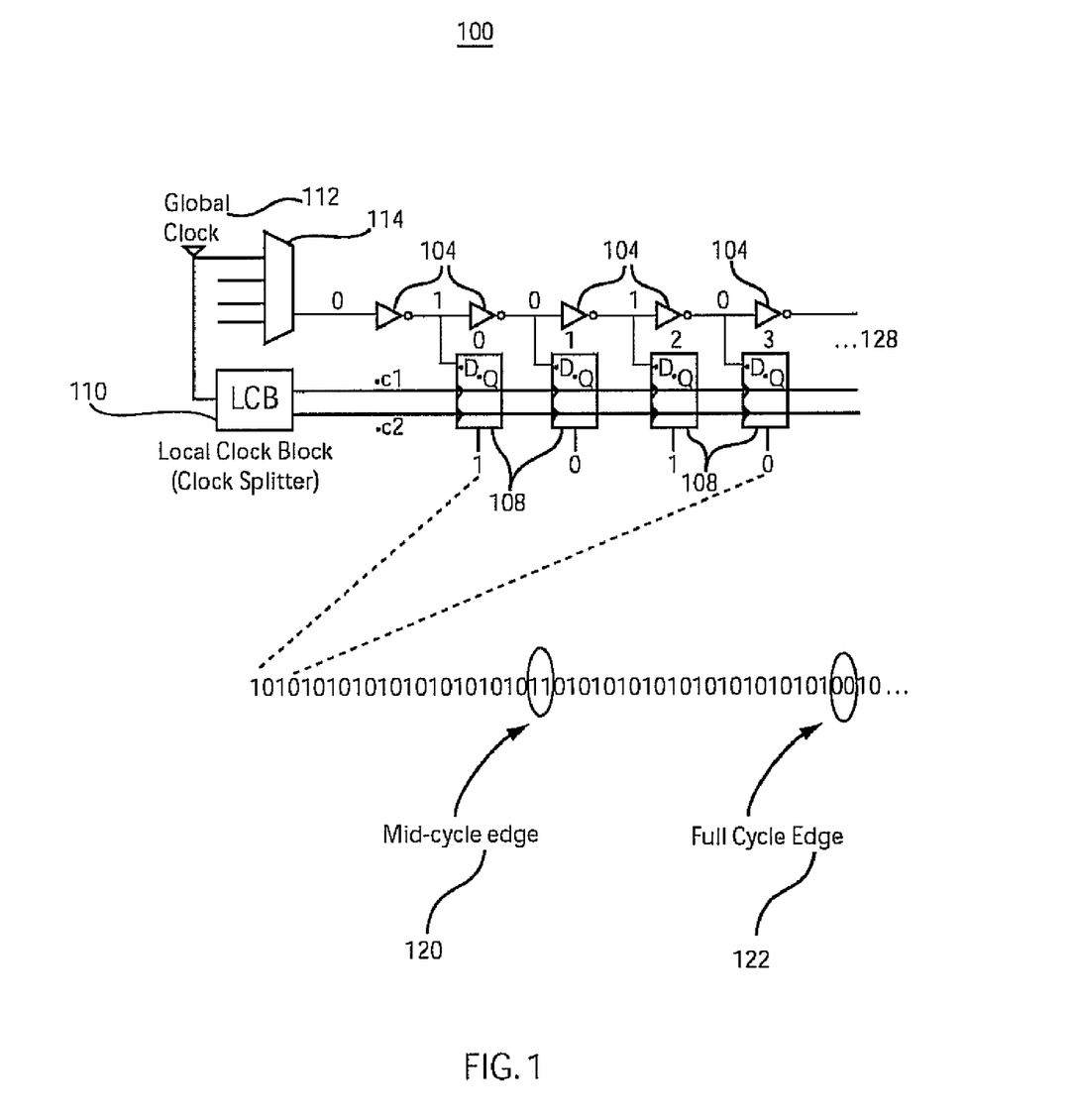
FIG. 1 is a schematic diagram showing a skitter circuit in accordance with one embodiment.

Referring now to the drawings in which like numerals represent the same or similar elements and initially to FIG. 1, a skitter circuit 100 includes a delay line 102. Delay line 102 includes a plurality of delay elements 104. The delay elements 104 may include inverters, although of types of delay elements may be employed instead of or in addition to inverters, e.g., inverting transmission gates, stacked inverters, logic gates, etc. A plurality of sampling latches 108 tap the delay line 102, such that a data input (D) for each latch 108 is connected between two delay elements 104.

The latches 108 are clocked in accordance with clocks c1 and c2. Clocks c1 and c2 are derived from a global clock 112, which may be a chip clock or even a local clock for a portion of an integrated circuit chip. Clock 112 may be split in a local clock block (LCB) 110, such that c1 and c2 are the data capture and data launch clocks which are derived from the same clock global signal, running along different conductors. In one embodiment, c1 operates a master latch and c2 operates a slave latch in latches 108. (However, for some master-slave latches, only one clock is needed.) The rising edge of the clock may trigger the master, and the falling edge of the clock may trigger the slave.

Latches 108 are operated in accordance with c1 and c2 to pass sampled data (D) received from the delay line 102. In the embodiment shown, 128 latches 108 may be employed. This number corresponds with the structure or bandwidth of a given device and may be changed as needed.

In this embodiment, wordlines 130 are multiplexed with an on-product clock generator (OPCG) or global clock 112. In a first portion of testing, the OPCG 112 is run through circuit 200 to determine the transition to calibrate a clock period of the signal. This is performed at a known input clock speed, e.g., a clock generated by a ring oscillator or other clocking device. The clock calibration is employed to calibrate the OPCG clock 112. At this stage, transitions are obtained and pulse measurements are performed for the OPCG clock signal (see e.g., FIG. 6).

Figure 2:
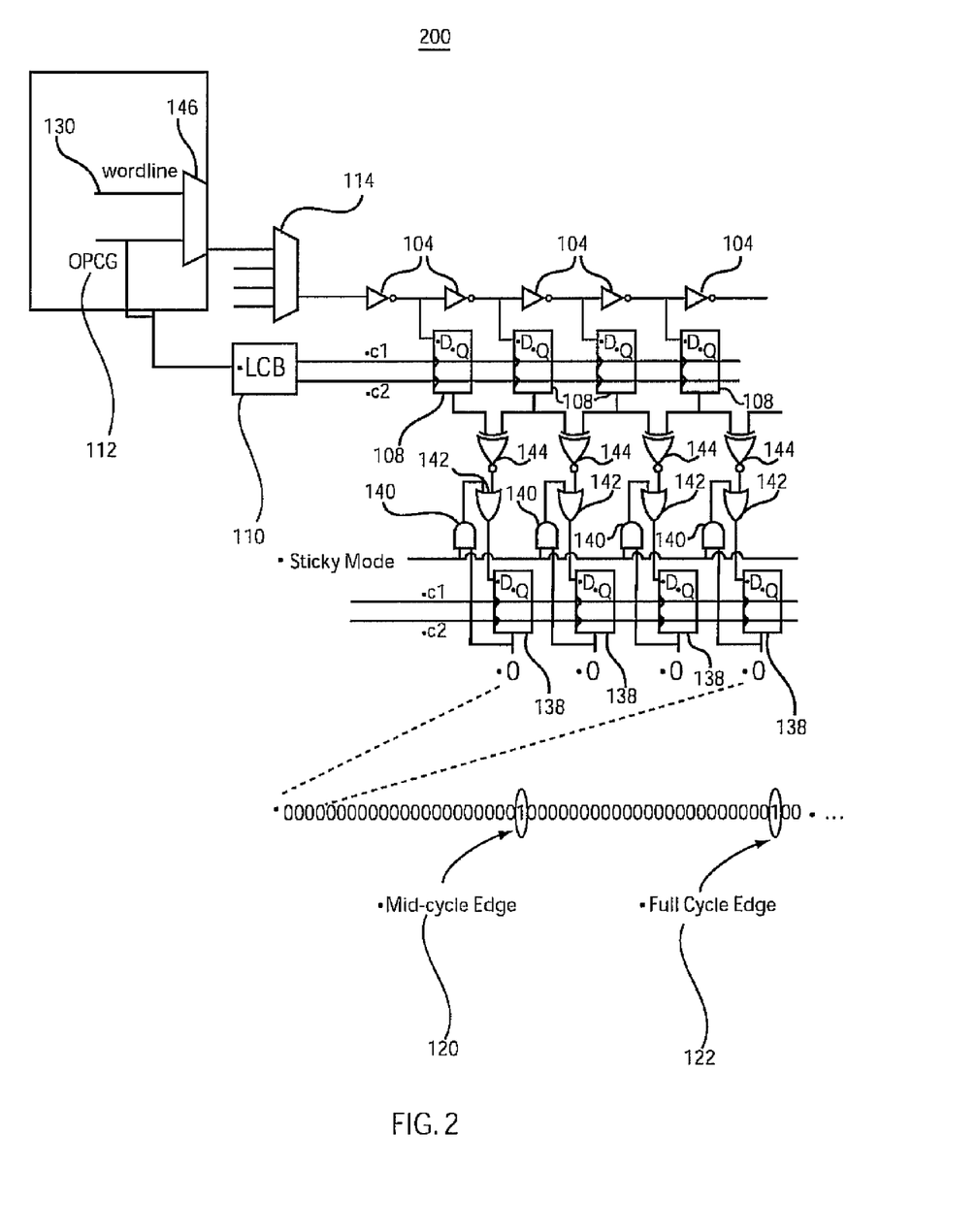
FIG. 2 is a schematic diagram showing a skitter circuit with additional logic in accordance with another embodiment.

Multiplexer 114 may then switch to a wordline signal input 130. Wordline signals 130 are multiplexed and input to the skitter circuit 200 for edge detection. The initial delay element 104 and sampling latch data is an alternating pattern of 1's and 0's. Edges of the wordline trace or signal and the clock signal result in mid-cycle edges 120 and full cycle edges 122. By analyzing the latch outputs (Q), a sequence of binary data results in an alternating pattern where the edges or transitions are denoted by binary digits of a same value adjacent to one another (e.g., 11 or 00).

Referring to FIG. 2, a skitter circuit 200 including additional circuitry for measuring features such as access times is illustratively depicted. Circuit 200 uses the circuit 100 of FIG. 1 utilizing a skitter type of method. The outputs of sampling latches are coupled to exclusive NOR gates (XNOR) 144 or other equivalent logic. The XNOR gates 144 test whether adjacent latches 108 have the same data value. The XNOR gates 144 determine edge locations for internal pulses of e.g., a wordline.

Sticky logic 150 is employed to convert the alternating 1's and 0's to a string of 0's with 1's at the transitions. Sticky logic 150 may include an AND gate 140 having a first input as a sticky mode enable signal and a second input as an output of an accumulation latch 138. An output of the AND gate 140 is logically combined with an output of the XNOR gate 144 using a NOR gate 142. An output of the NOR gate 142 is input as data (D) to latch 138.

Accumulation latches 138 are clocked using c1 and c2 from LCB 110. LCB 110 employs a global clock or OPCG 112 to provide a clock signal. A wordline 130 has its signal multiplexed by a multiplexer 146. The multiplexing of the signals of wordline 130 or the OPCG clock 112 is provided to select between the wordline and the OPCG for edge detection. Other signal types may also be employed instead of or in addition to wordline signals.

In this embodiment, wordlines 130 are multiplexed with an on-product clock generator (OPCG) or global clock 112. In a first portion of testing, the OPCG 112 is run through circuit 200 to determine the transition to calibrate a clock period of the signal. This is performed at a known input clock speed, e.g., a clock generated by a ring oscillator or other clocking device. The clock calibration is employed to calibrate the OPCG clock 112. At this stage, transitions and pulse measurements are performed for the OPCG clock signal (see e.g., FIG. 6).

Multiplexer 114 can then switch to a wordline signal input 130. Wordline signals 130 are multiplexed and input to the skitter circuit 200 for edge detection. The initial delay element 104 and sampling latch data is an alternating pattern of 1's and 0's. Edges of the wordline signal 130 result in mid-cycle edges 120 and full cycle edges 122. By analyzing the latch outputs (Q), a sequence of binary data results where the edges or transitions are denoted by binary bits.

The clock acts as a reference against the wordline signal; so that edges or changes in the wordline signal can be detected using the delay elements (inverters) 104, sampling latches 138 and XNOR circuits 144. Since the initial delay element and sampling latch data is, e.g., "0101010101 . . . ", any transition of the edges makes two adjacent latches 108 have a same value (e.g., 11) due to delays in the inverter stages.

Knowing the number of delay elements (inverters) 104 in the skitter circuit 200, the inverter delay can be analyzed. The number of 0's output from the accumulation latches 138 correspond to the number of inverters which are already calibrated. Thus, pulsewidth of a wordline can be accurately estimated to one inverter delay. Pulsewidth can be analyzed by locating the transitions of wordline and cycle time.

Circuit 200 (and/or circuit 100) can be incorporated in an automatic built-in self test (ABIST) module or block in an integrated circuit. The ABIST may be run to test or measure components after manufacture of a chip. Alternately, the circuit 200 (and/or 100) may be employed off-chip as well and work in conjunction with on-chip circuitry to test/measure internal pulses. Advantageously, the pulse width can be measured with a precision of at least one delay element delay.

Figure 3:
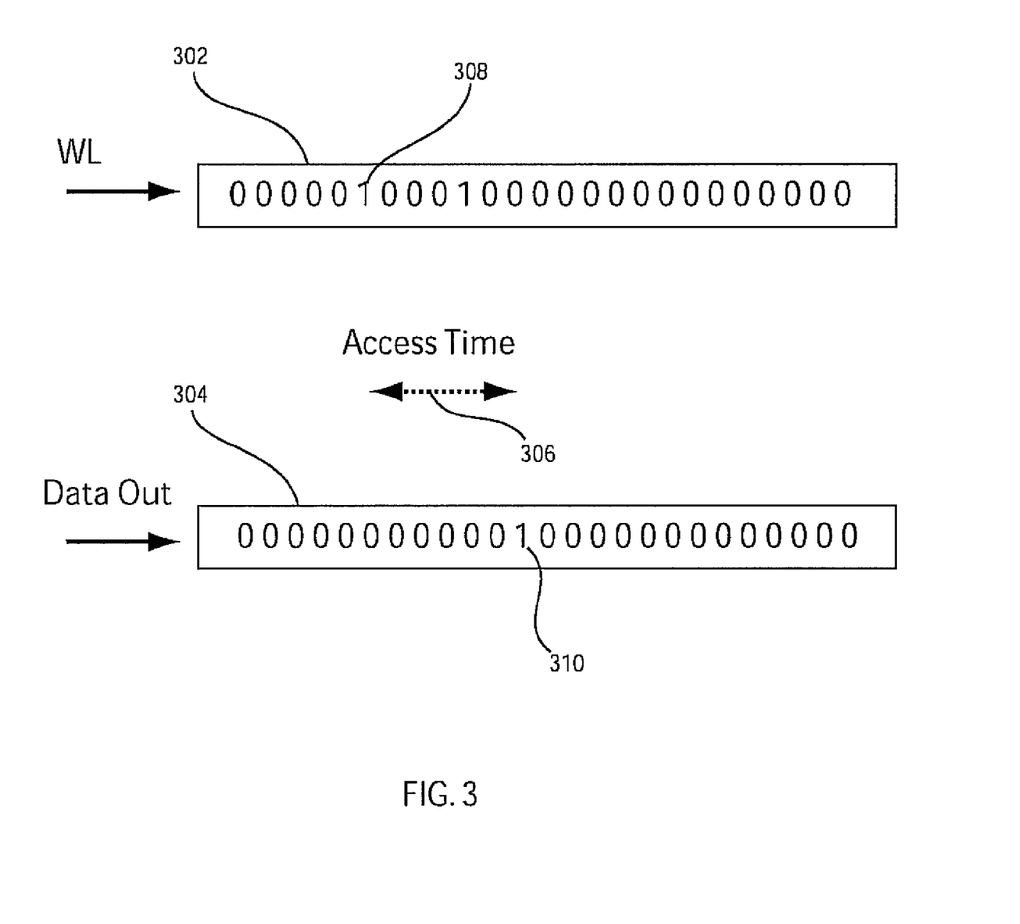
FIG. 3 depicts two bit sequences to indicate a computation of access time in accordance with one illustrative embodiment.

Referring to FIG. 3, two data sequences representing an output of a skitter circuit and an output of a memory device are illustratively shown. A first sequence 302 represents the states of a wordline during a read operation. The word line is applied to the skitter circuit and transitions are indicated by 1's. The output data are obtained from the circuit using a normal data output channel. An access time measurement for an access time 306 may be performed using one or more skitter circuits. In this case, the clock cycles are compared and aligned, and the time from a first transition 308 of the wordline to a time when the data is read out from memory (310) is measured to provide the access time 306. The precision in one inverter delay period. Although in an alternate embodiment, sub-delay element measurement resolution is achievable by employing a histogram mode for access time measurement.

Figure 4:
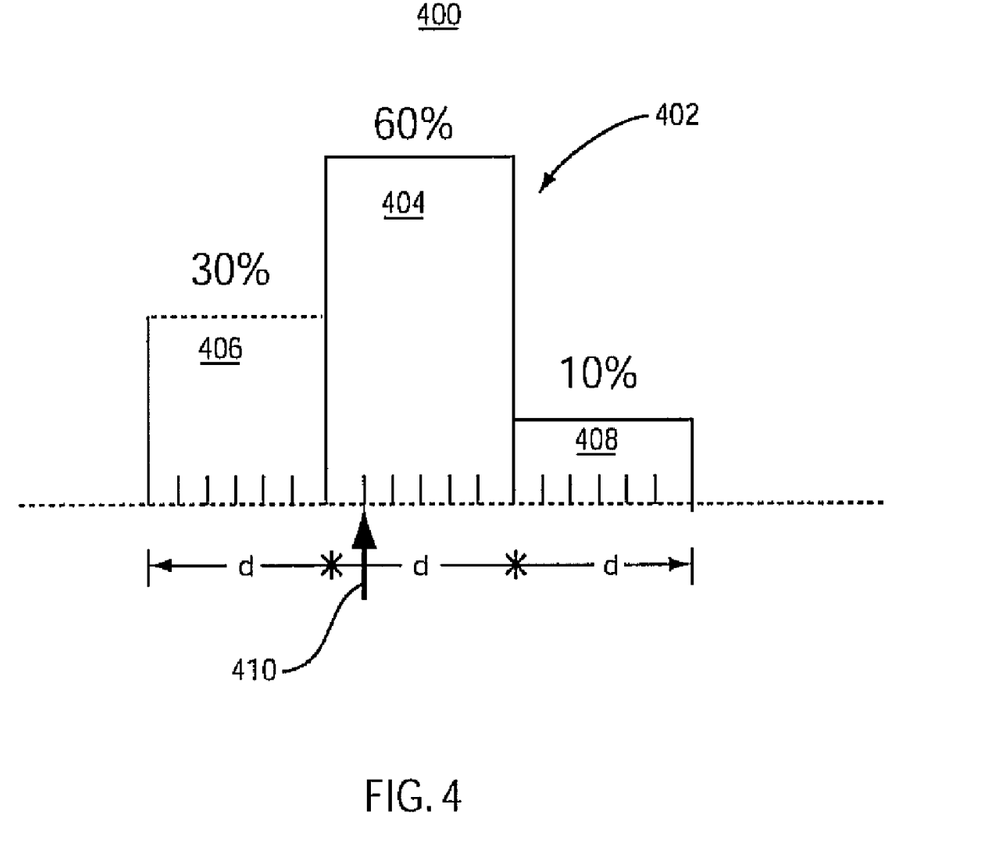
FIG. 4 is a histogram showing transition frequency for a plurality of buckets delineated by the magnitude of inverter delay.

Referring to FIG. 4, in one embodiment, a histogram mode 400 provides sub-inverter delay accuracy for internal pulse measurements using a histogram 402. Using repeated skitter circuit measurements, a distribution of edge locations can be deciphered. Where the edge falls as the output of the skitter circuit is determined to an inverter delay (d) accuracy. However, a mean value 410 may be estimated based upon the distribution of edge locations to determine where in a bucket (e.g., 404, 406, 408) of d size the mean falls. By employing the distribution between buckets (e.g., 30% for bucket 406, 60% for bucket 404, 10% for bucket 408) a sub "d" accuracy can be achieved.

Figure 5:
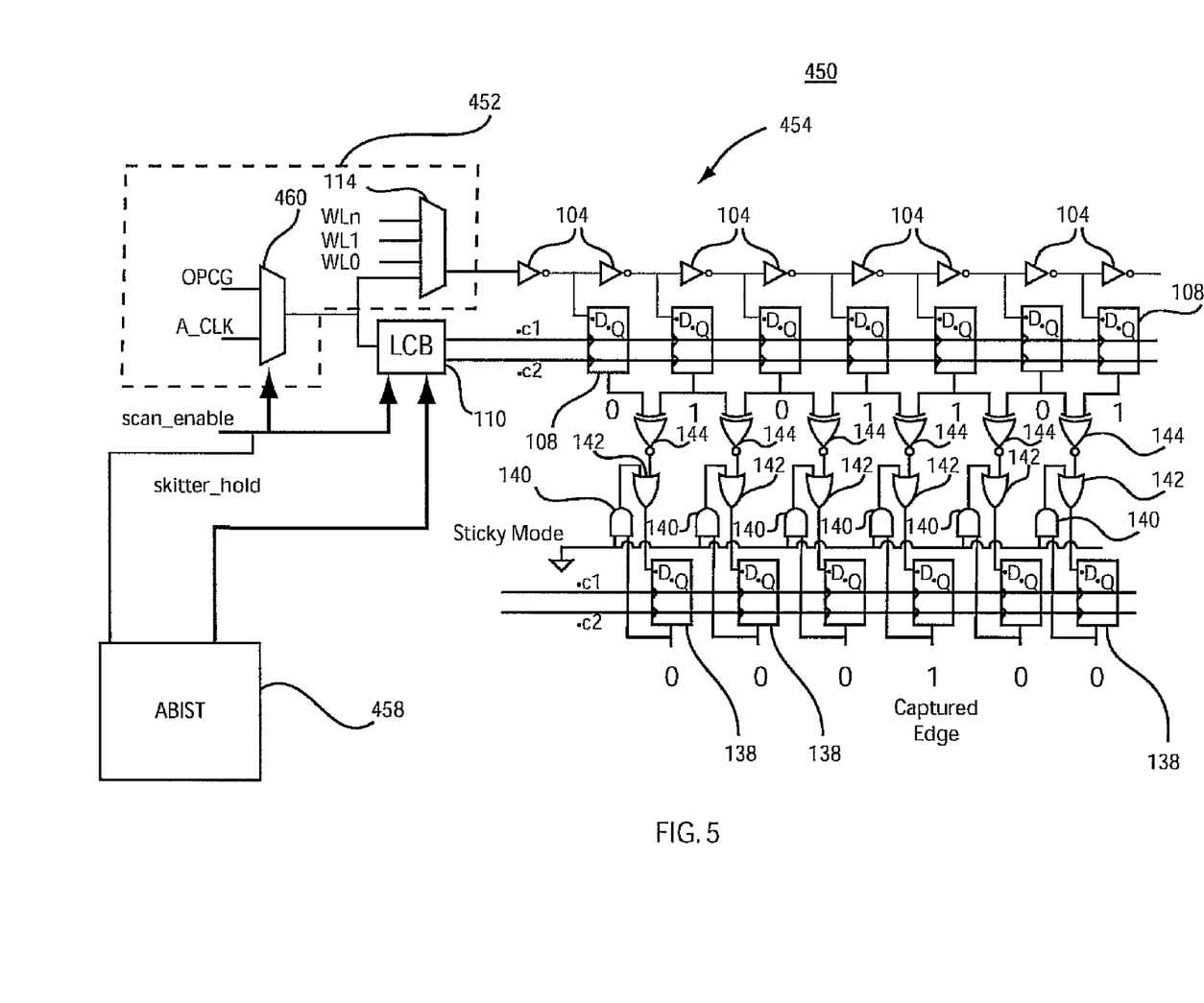
FIG. 5 is a schematic diagram showing a skitter circuit controlled in accordance with an ABIST engine in accordance with another embodiment.

Referring to FIG. 5, a circuit 450 includes a number of modifications to make the circuit work for internal signal measurement. An enable circuit 452 includes an input multiplexing structure that permits several wordline signals to be multiplexed with a reference clock (OPCG) employed for calibration. The enabling structure 452 may be employed with circuits 100 and 200 as well.

The OPCG is multiplexed with a much slower speed A_CLK during scan-mode to achieve slow-speed scanning consistent with the array and ABIST (array built-in self test) methodology. Advantageously, an ABIST engine 458 supplies commands to the multiplexer structure 452 and the skitter circuit 454. A scan_enable pin controls a multiplexer 460 so that in functional mode, the regular fast OPCG is used, but in scan mode, the slower A_CLK is used to slowly scan the latches 108. The scan_enable may be provided by the ABIST engine 458 or by another source.

The ABIST engine 458 is a special purpose pattern generator that generates stimulus address/data patterns for the arrays as well as control data. It also takes the data outputs from the arrays and compares them to the expected (good) values to determine if the arrays are working. The ABIST engine 458 is employed in conjunction with the skitter circuit 454 to generate the correct wordline address signals, so that skitter circuit 454 can sample the wordline signals. Further, when the test is complete, the ABIST engine 458 programs a "hold" signal (skitter-hold) to be sent over to the skitter that would lock-in or "freeze" the captured wordline pulse data in the skitter latches 138, until it was eventually scanned out. The "hold" signal from the ABIST engine 458 is connected to the clock gating port of the skitter LCB (local clock blocks) 110 which then inhibits the local clocks c1, c2 from firing at the end of a test.

Figure 6:
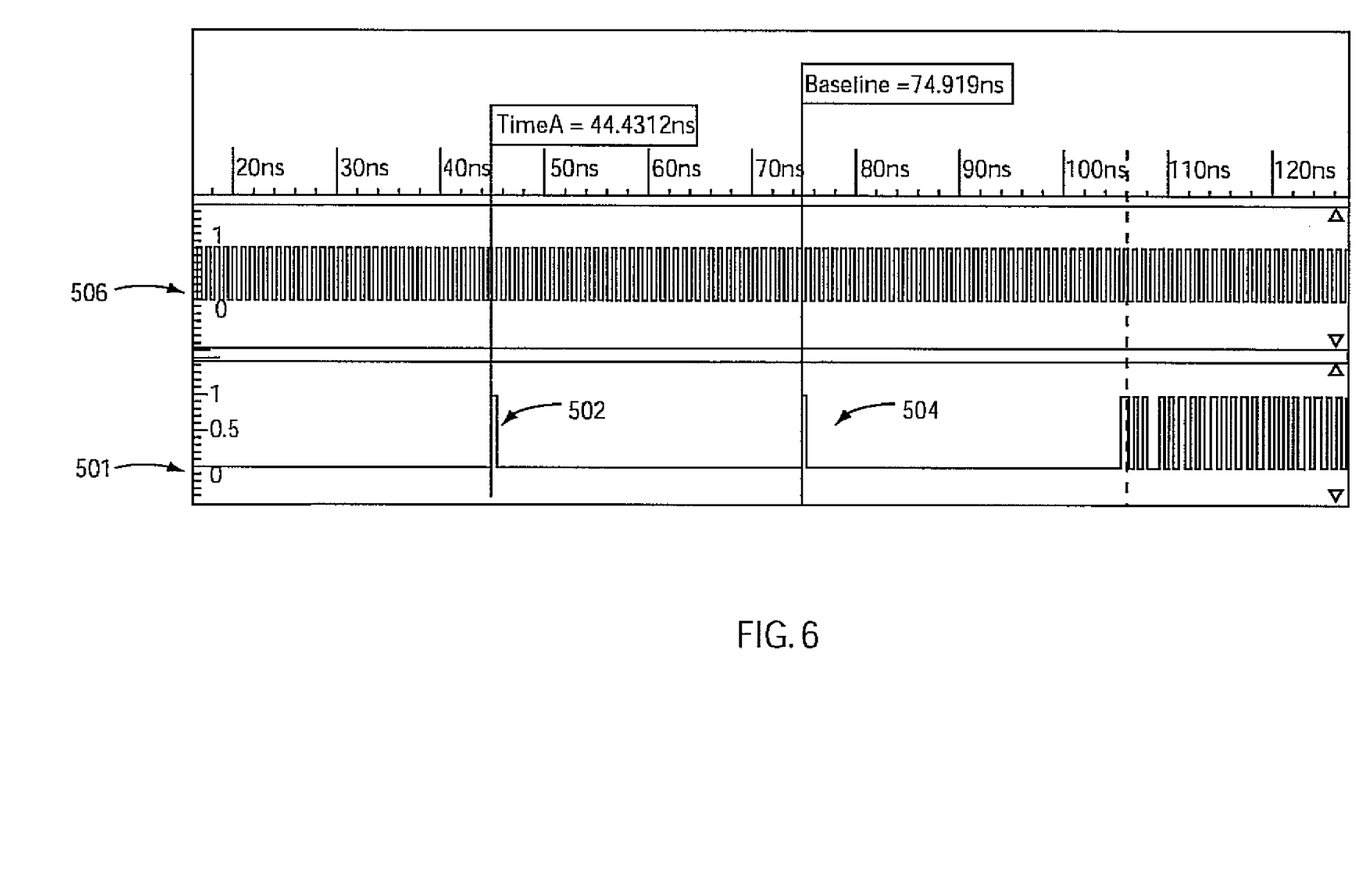
FIG. 6 is plot showing a reference clock pulse and a pulse signal for an on-product clock generator (OPCG) with edges employed in calibration of the OPCG.
Figure 7:
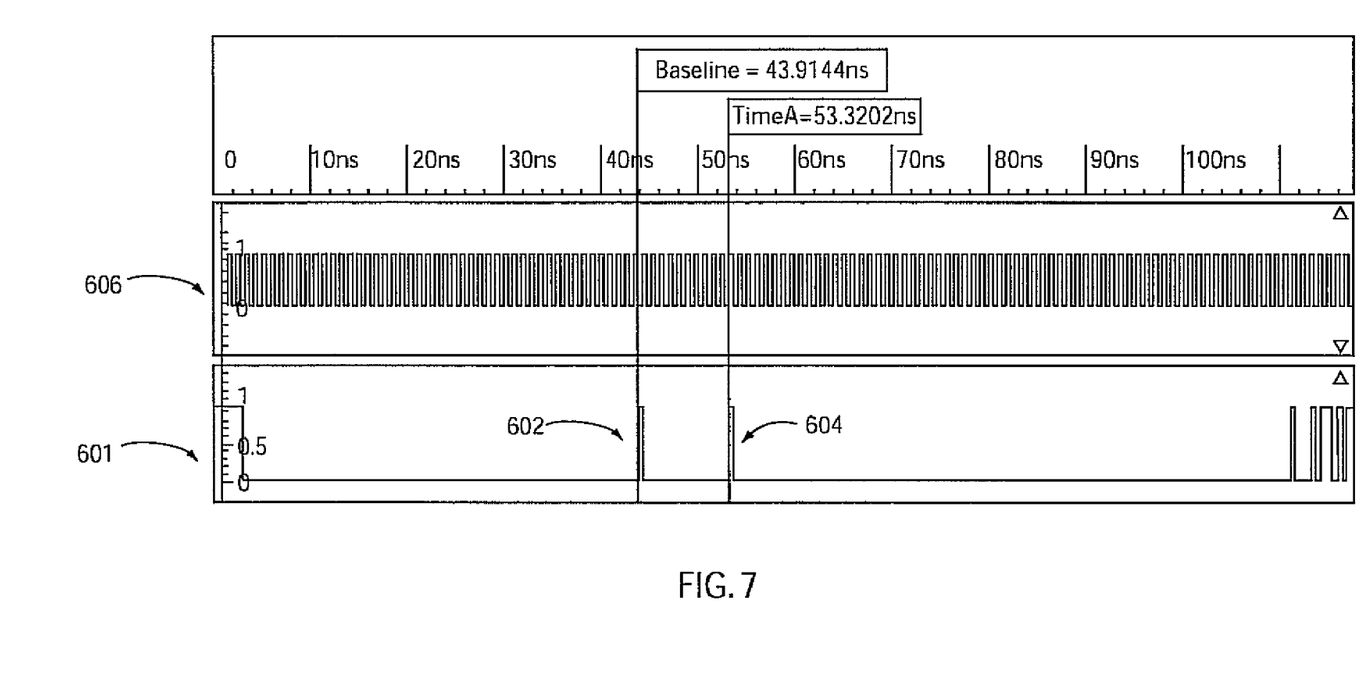
FIG. 7 is plot showing a reference clock pulse and a pulse signal with edges for a wordline employed in measuring pulse width for internal pulses.

Referring to FIGS. 6 and 7, a sample measurement is described. In FIG. 6, a skitter circuit output 501 is employed in OPCG mode to determine edges 502 and 504. An input clock (OPCG) 506 has a known phase, e.g., 250 ps. The edges 502 and 504 are measured against the clock 506 to determine their time of occurrence. In this example, edge 502 occurs at time=44.4312 ns and edge 504 occurs at time=74.919 ns. A pulse scan separation is the difference between these or 30.5 ns. This corresponds to the known 250 ps wide clock pulse, and thus gives us a calibration.

In FIG. 7, a skitter circuit output 601 is employed in wordline mode to determine edges 602 and 604 of a wordline signal. The edges 602 and 604 are measured against the clock reference just described to determine their separation. In this example, edge 602 occurs at time=43.9144 ns and edge 604 occurs at time=53.3202 ns. A pulse scan separation is the difference between these or 9.5 ns. The pulse width of the wordline can now be determined. For example, Pulse-width$_{WL}$=(9.5/30.5)*250 ps=77.9 ps.

Figure 8:
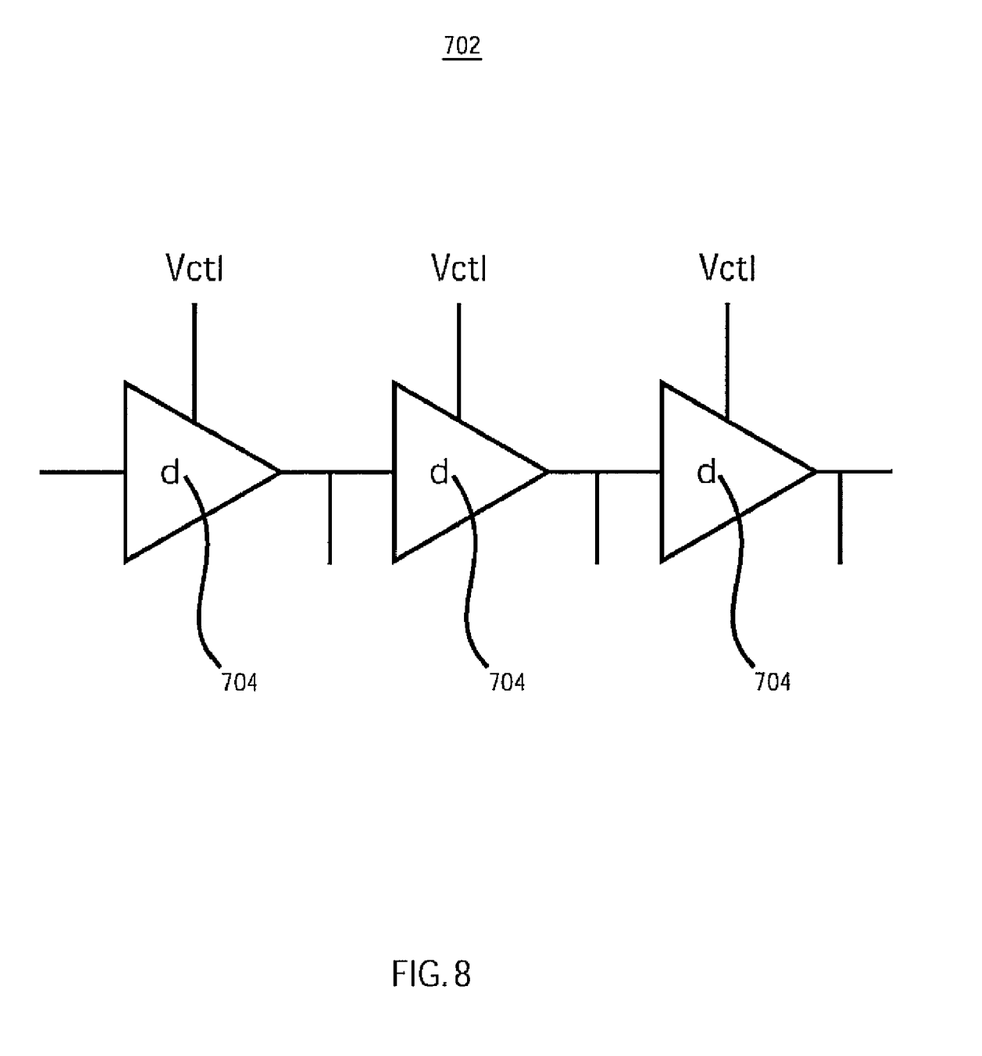
FIG. 8 is a schematic diagram of an inverter chain with adjustable precision in accordance with one embodiment.

Referring to FIG. 8, the resolution/precision of the skitter circuit may be modified in real-time or designed in advance into the circuit. A delay chain 702 employed in a skitter circuit (e.g. circuit 100 or 200) is illustratively shown. Delay chain 702 includes delay elements 704 (e.g., inverters, although other delay elements may be employed). Delay elements 704 provide a delay "d". "d" may be selected by a design to provide a preferable or desired resolution of internal pulse measurements. For example, a delay may be selected to provide a preferred resolution e.g., 6 ps in one embodiment. However, if more resolution (or less) is needed then other values may be selected, 5 ps, 7 ps, etc.

In addition or alternately, real-time adjustment may be employed. Each delay element 704 is powered by a control or supply voltage Vctl. Vctl may be adjusted to alter the delay "d" of the delay element 704. This may be done as a way of tuning the circuit or to adjust the precision for different measurements. This technique may be employed on-chip and permit manual or programmable changes to the delay value, d. Other methods may be employed to alter the delay value in accordance with the present principles as well.

Figure 9:
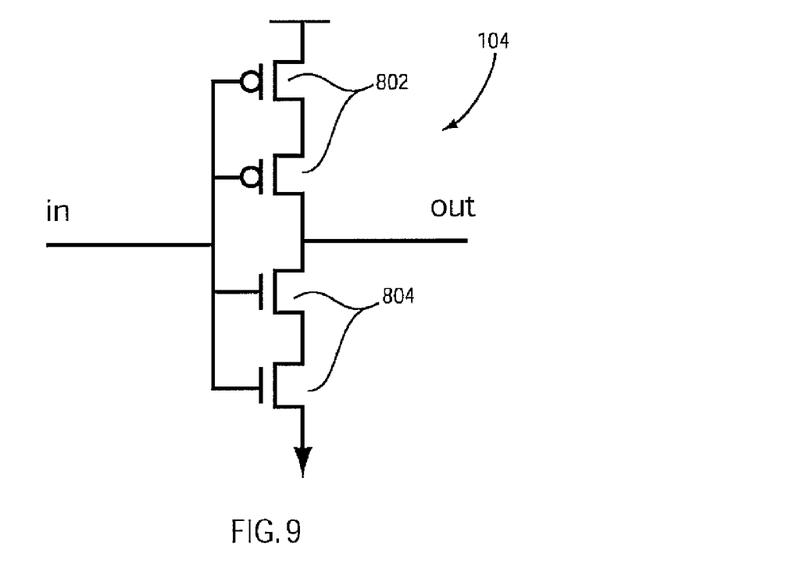
FIG. 9 is a schematic diagram of a stacked inverter that may be employed in the inverter chain in accordance with one embodiment.
Figure 10:
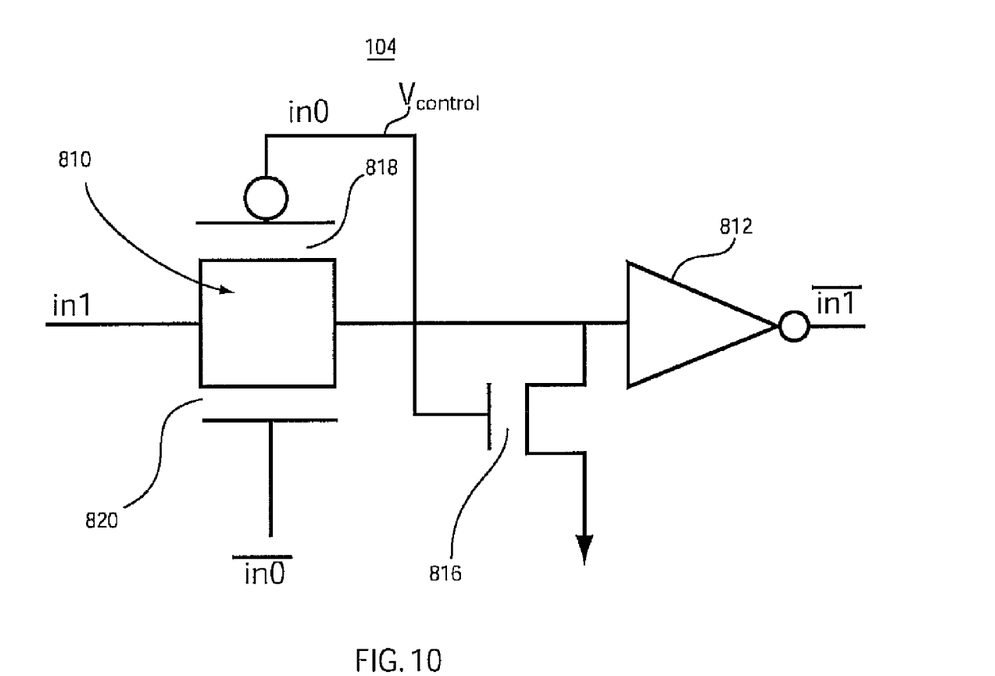
FIG. 10 is a schematic diagram of another delay element that may be employed in the skitter circuit in accordance with one embodiment.

Further, the inverter delay elements 104 may include other structures such as stacked inverters 104 which may include (2 PFETS 802 and 2 NFETS 804) to save leakage power, as depicted in FIG. 9. FIG. 10 shows yet another illustrative delay element 104. In FIG. 10, in addition to an inverter 812, a gate 810 is employed with one of the inputs (in0) coupled to the gate of an NFET 816. in0=0, or can be varied between 0 and 1 (ground and Vdd) to provide a variable delay element by altering the strengths of PFET 818 and NFET 820. In0 may be controlled by V$_{control}$ from a voltage regulator or other voltage control source. in1 is the data input to the delay element. Other delay elements (104) are also contemplated.

While circuits and methods for measuring internal pulses have been illustratively described, in accordance with particularly useful embodiments, wordline pulsewidth, wordline duty cycle, bitline slews, access times (e.g., wordlines to output), etc. can be measured, among other parameters. This includes in-line measurement for internal nodes of any logic or memory device. The present embodiments can be extended to any signals for logic as well as memories, including e.g., e-DRAMs.

The measurements can be performed with up to one inverter delay and even sub-inverter delay values. By employing the skitter circuit, other parameters or aspects, such as VCS and supply voltage noise, can be analyzed. VCS is the voltage supply that services only the memory elements and the word line drivers of an SRAM, but not the decode circuitry and other support circuitry within the SRAM macro. Separating the memory elements and word line drivers permits for more robust operation of the overall SRAM. The skitter circuit may also be employed to stress memory cells (e.g., 6-T or 8-T SRAM cells or other technologies).

Having described preferred embodiments of method and apparatus for calibrating internal pulses in an integrated circuit (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for measuring internal pulses in an integrated circuit, comprising:
   enabling operation of an on-chip pulse measuring circuit in accordance with a built-in self test engine and a plurality of internal signals from at least one on-chip circuit component being tested;
   receiving a pulse signal from the at least one on-chip circuit component;
   applying the pulse signal to an inverter chain;
   tapping the inverter chain between adjacent inverters with sampling latches, where each sampling latch has a data input coupled to the inverter chain; and
   comparing adjacent outputs of the sampling latches in an output sequence to indicate a transition in the signal pulse.

2. The method as recited in claim 1, further comprising logically combining sampling latch outputs for two adjacent sampling latches such that a transition in one of a clock signal and the internal pulse is indicated by comparing the sampling latch outputs.

3. The method as recited in claim 1, further comprising measuring one of pulse width, access time, bitline slew and duty cycle of an internal pulse based on transitions in the pulse signal.

4. The method as recited in claim 1, further comprising holding the output sequence by providing a hold signal from the built-in self test engine.

5. The method as recited in claim 1, further comprising measuring access time for a memory cell by detecting a first transition of a wordline and comparing the first transition to a transition detected when data is read out from the memory cell.

6. The method as recited in claim 5, wherein the access time include a number of delays between the first transition to the transition detected when data is read out.

7. The method as recited in claim 1, further comprising adjusting a delay in the inverter chain to adjust the precision of the transition indication.

8. The method of claim 7, wherein adjusting the interval includes adjusting the delay value of at least one delay element.

9. A method for measuring internal pulses in an integrated circuit, comprising:
   enabling operation of an on-chip pulse measuring circuit in accordance with a built-in self test engine and a plurality of internal signals from at least one on-chip circuit component being tested;
   sampling a signal pulse from the at least one on-chip circuit component at an interval to indicate a transition in the signal pulse; and
   adjusting the interval in real-time to adjust the precision of the transition indication.

* * * * *